United States Patent [19]
Coveley

[11] Patent Number: 5,952,835
[45] Date of Patent: Sep. 14, 1999

[54] NON-CONTACT PROXIMITY DETECTOR TO DETECT THE PRESENCE OF AN OBJECT

[76] Inventor: Michael Coveley, 45 Ironshield Crescent, Thornhill, Ontario L3t 3K7, Canada

[21] Appl. No.: 08/750,028
[22] PCT Filed: May 23, 1995
[86] PCT No.: PCT/CA95/00300
§ 371 Date: Feb. 5, 1997
§ 102(e) Date: Feb. 5, 1997
[87] PCT Pub. No.: WO95/32438
PCT Pub. Date: Nov. 30, 1995

[30] Foreign Application Priority Data
May 25, 1994 [GB] United Kingdom .................... 9410461

[51] Int. Cl.$^6$ .................................................. G01R 27/26
[52] U.S. Cl. ........................... 324/671; 324/674; 324/681; 340/562
[58] Field of Search ..................................... 324/661, 662, 324/663, 666, 667, 674, 677, 681, 686; 340/686, 687, 524, 541, 545, 561, 562, 568, 571

[56] References Cited

U.S. PATENT DOCUMENTS

| | | | |
|---|---|---|---|
| 3,067,364 | 12/1962 | Rosso ....................................... | 361/181 |
| 3,675,051 | 7/1972 | Mioduski ................................. | 340/562 |
| 4,887,024 | 12/1989 | Sugiyama et al. ....................... | 324/674 |
| 4,994,793 | 2/1991 | Curtis ....................................... | 340/666 |
| 5,287,086 | 2/1994 | Gibb ........................................ | 324/674 |
| 5,465,091 | 11/1995 | Nishino et al. .......................... | 324/686 |

FOREIGN PATENT DOCUMENTS 2 036 840  7/1970  Germany .

*Primary Examiner*—Diep N. Do
*Attorney, Agent, or Firm*—Baker & Daniels

[57] ABSTRACT

A non-contact capacitive proximity detector includes a sensing plate and detection circuitry electrically coupled to the sensing plate. The detection circuitry comprises an oscillator electrically connected to the sensing plate and signal conditioning circuitry electrically connected to the oscillator. The signal conditioning circuitry includes a coupling capacitor $C_1$, an envelope demodulator, a first comparator, a delay circuit and a second comparator. When an object is within a predetermined proximity to the sensing plate, the capacitance of the capacitor constituted by the sensing plate and the proximal object is at a level which causes the oscillator to generator an oscillating signal having a sufficient magnitude. The oscillating signal generated by the oscillator is applied to the envelope demodulator by way of the coupling capacitor. The envelope demodulator generates an envelope of the oscillating signal and applies the envelope to he first comparator. The first comparator in turn generates a logic high output which is fed to the delay circuit. The delay circuit in turn passes the logic high output to the second comparator after a predetermined amount of time has elapsed causing the second comparator to generate a logic high output representative of the presence of than object within a predetermined proximity to the sensing plate. When the object is removed from the sensing plate outside the predetermined proximity, the output of the proximity detector changes allowing the proximity detector to serve as a removal detector.

11 Claims, 1 Drawing Sheet

NON-CONTACT PROXIMITY DETECTOR TO DETECT THE PRESENCE OF AN OBJECT

TECHNICAL FIELD

The present invention relates to proximity detectors and in particular, to a non-contact proximity detector which relies upon a capacitive proximity effect to detect the presence of an object.

BACKGROUND ART

Proximity detectors are known in the art and three basic types of proximity detectors exist, namely electromagnetic, optical and ultrasonic. Electromagnetic proximity detectors may be subdivided into inductive and capacitive types. Most inductive proximity detectors respond to the presence of any metal object, although ferrous metals give the best response (about two-thirds higher than for non-ferrous metals).

One common principal of operation for inductive proximity detectors involves the use of an eddy current killed oscillator (ECKO). The oscillator is in the form of a tuned LC tank circuit amplifier. A sensor coil and ferrite core form the inductor. The amplifier provides just enough positive feedback to make the circuit oscillate in the RF range. When a metal object is positioned near the detector, the RF field causes eddy currents to flow in the surface of the metal object. When the metal object reaches a predetermined proximity to the detector, (depending on the detector sensitivity), the load caused by the eddy currents is enough to disable the oscillator. A level detector is connected to the oscillator for producing an output signal. Usually, a certain amount of hysteresis (differential travel) is built into the detector. The purpose of the hysteresis is to prevent chatter when the metal object is positioned right at the oscillation threshold point of the oscillator.

Although these inductive proximity detectors are suitable for detecting the presence of a metal object, when using these types of detectors to detect the presence of a portion of an individual, such as a hand, the inductive detection methods yield non-linearities that result in large errors. Because the human hand represents an irregular reflective surface, optical and ultrasonic proximity detectors are also unsuitable.

Capacitive proximity detectors have been used to detect the presence of a human hand. In these prior art capacitive proximity detectors, differential capacitive arrangements have been implemented wherein the centre plate of the capacitive arrangement is formed by the hand to be detected. Human tissue exhibits certain electrical properties (such as relatively low impedance to surrounding grounds at 100 kHZ), which are sufficient to make such arrangements practical. In capacitive arrangements of this nature, the centre plate (constituted by the hand) is maintained at ground potential and two fixed capacitors are provided in a complex bridge configuration. Unfortunately, these prior art capacitive proximity detectors are bulky, complex and have significant power requirements.

It is therefore an object of the present invention to provide a novel proximity detector.

DISCLOSURE OF THE INVENTION

According to one aspect of the present invention there is provided a non-contact proximity detector comprising:

a sensing plate forming a plate capacitor with said object when said object to be sensed is adjacent said plate, said capacitor changing capacitance as said object approaches said plate; and detection means responsive to said change in capacitance and generating output representative of the presence of said object when said object is within a predetermined proximity to said sensing plate.

According to another aspect of the present invention there is provided a non-contact proximity detector to detect the presence of a human appendage comprising:

a sensing plate forming a plate capacitor with said appendage when said appendage to be sensed is adjacent said plate, said capacitor changing capacitance as said appendage approaches said plate; and detection means responsive to said change in capacitance and generating output representative of the presence of said appendage when said appendage is within a predetermined proximity to said sensing plate.

Preferably, the detection means includes an oscillator responsive to the change in capacitance for generating an oscillating signal having a magnitude which varies as a function of the capacitance and signal conditioning means responsive to the oscillating signal and generating output representative of the presence of the object or appendage when the magnitude of the oscillating signal is above a threshold value. It is also preferred that the signal conditioning means includes delay means to delay a change in the output of the signal conditioning means upon a change in the position of the object or appendage relative to the sensing plate.

In a specific embodiment, it is preferred that the signal conditioning means includes an envelope demodulator to generate an envelope of the oscillating signal, a first comparator receiving the envelope and generating output when the magnitude of the envelope is above the threshold value, a delay circuit receiving the output of the first comparator and passing the output to a second comparator after a predetermined time has elapsed. The second comparator generates the output representative of the presence of the object or appendage in response to the output received from the delay circuit.

The present invention provides advantages in that the design of the proximity detector eliminates the need for a complex bridge configuration that is required in prior art capacitive proximity detectors. Also, the present proximity detector has a compact design and consumes very little power as compared to conventional proximity detectors.

BRIEF DESCRIPTION OF THE DRAWING

An embodiment of the present invention will now be described more fully with reference to the accompanying drawing in which.

BEST MODE FOR CARRYING OUT THE INVENTION

Figure 1:
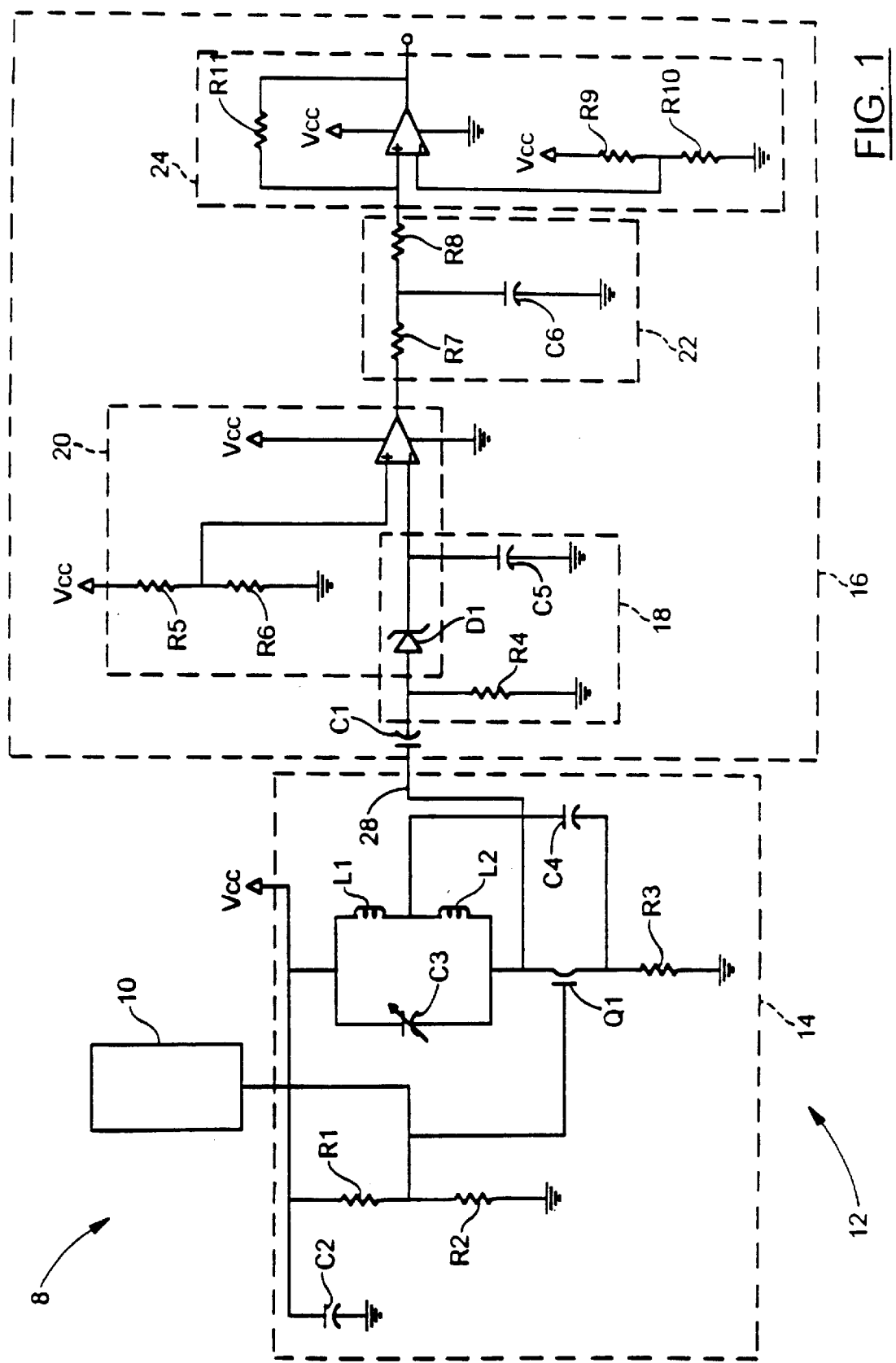
FIG. 1 is a schematic diagram of a non-contact capacitive proximity detector.

Referring now to FIG. 1 a non-contact capacitive proximity detector is shown and is generally indicated by reference numeral 8. The proximity detector 8 includes a sensing plate 10 which may be encased in a dielectric, and detection circuitry 12 electrically coupled to the sensing plate 10. The detection circuitry includes an oscillator 14 electrically connected to the sensing plate 10 and signal conditioning circuitry 16 electrically connected to the oscillator 14. The signal conditioning circuitry 16 includes a coupling capacitor $C_1$, an envelope demodulator 18, a first comparator 20, a delay circuit 22 and a second comparator 24.

The oscillator 14 is in the form of a Hartley's LC oscillator and includes capacitors $C_2$, $C_3$ and $C_4$, inductors $L_1$ and $L_2$, resistors $R_1$, $R_2$ and $R_3$ as well transistor $Q_1$.

As can be seen, capacitor $C_2$ is connected between a positive voltage source Vcc and ground. Resistors $R_1$ and $R_2$ which form a voltage divider also extend between the voltage source Vcc and ground. The tap from the voltage divider extends to the base of transistor $Q_1$ as well as to the sensing plate 10. The emitter of transistor $Q_1$ leads to ground by way of resistor $R_3$. Capacitor $C_3$ is arranged in parallel with the two inductors $L_1$ and $L_2$ which themselves are arranged in series. This parallel circuit constituted by capacitor $C_3$ and inductors $L_1$ and $L_2$ extends between the voltage source Vcc and the collector of transistor $Q_1$. Capacitor $C_4$ is connected between the inductors $L_1$ and $L_2$ and the emitter of transistor $Q_1$. The output lead 28 of the oscillator 14 extends from the collector of transistor $Q_1$ to one terminal of the coupling capacitor $C_1$.

Capacitor $C_3$ is in the form of a variable trimer capacitor to allow the tuning and sensitivity of the oscillator 14 to be adjusted. An additional capacitor can be included in the event that capacitor $C_3$ fails to allow the tuning and sensitivity of oscillator 14 to be adjusted as desired. In this particular embodiment, the gain of transistor $Q_1$ is selected to be large enough to ensure that the oscillating signal output of the oscillator 14 is sufficient when an object to be detected is within 3 to 5 cm of the sensing plate 10. The loop gain of the oscillator is also set sufficiently high so that the oscillating signal output produced by the oscillator closely approximates a pure sinewave.

The envelope demodulator 18 is constituted by resistor $R_4$, Shottky diode $D_1$ and capacitor $C_5$. Specifically, resistor $R_4$ is connected between capacitor $C_1$ and ground. The anode of diode $D_1$ is also connected to capacitor $C_1$. The cathode of diode $D_1$ leads to the inverting terminal of comparator 20 which is in the form of an operational amplifier (op-amp). Capacitor $C_5$ extends between the cathode of diode $D_1$ and ground. The non-inverting terminal of comparator 20 taps a voltage divider constituted by resistors $R_5$ and $R_6$. The values of the resistors forming the voltage divider determine the set threshold of the comparator 20. The output of the comparator 20 leads to the delay circuit 22 which is constituted by an RC network. Specifically, the RC network includes resistor $R_7$ having one of its terminals connected to the output of comparator 20 and the other of its terminals connected to the non-inverting terminal of comparator 24 by way of resistor $R_8$. Capacitor $C_6$ which also forms part of the RC network is connected between resistors $R_7$ and $R_8$ and ground.

Comparator 24 is also in the form of an op-amp and has its inverting terminal connected to a voltage divider constituted by resistors $R_9$ and $R_{10}$. A feedback loop constituted by resistor $R_{11}$ extends between the output and non-inverting terminals of comparator 24.

The operation of the non-contact proximity detector 8 will now be described. The sensing plate 10 forms one half of a plate capacitor. When an object is within a predetermined proximity to the sensing plate 10, the object and sensing plate arrangement form a plate capacitor whose capacitance is given by:

$C = \epsilon(A/d)$, where:

$\epsilon$ is the dielectric permittivity of air;

A is the area of the sensing plate 10; and d is the distance of the hand from the sensing plate.

Based on the above, it should be apparent that the nearer the object is to the sensing plate 10, the larger the capacitance of the capacitor constituted by the object and sensing plate arrangement becomes. When the capacitance reaches a predetermined value (which in this embodiment occurs when the object is within 3 to 5 cm of the sensing plate 10), oscillator 14 generates an oscillating signal having a frequency in the vicinity of 4.5 MHZ. The magnitude of the oscillating signal is dependant on the proximity of the object to the sensing plate and increases as the object approaches the sensing plate. The oscillating signal appearing on the output lead 28 of oscillator 14 is applied to the coupling capacitor $C_1$ which allows the AC oscillating signal to pass. The envelope demodulator 18 receives the AC oscillating signal from the coupling capacitor and generates output representing the positive envelope of the oscillating signal. To achieve this operation, the RC time constant of the envelope demodulator 18 is chosen to be small enough so that when the envelope decreases in magnitude, the voltage across the capacitor $C_5$ can fall fast enough to keep in step with the envelope but not so small so as to introduce excessive ripple.

The envelope output by the envelope demodulator 18 is filtered and then applied to the inverting terminal of comparator 20. When the magnitude of the envelope exceeds the set threshold of the comparator as determined by the voltage divider, the comparator 20 generates a logic high output. The logic high output of the comparator is then applied to the RC network which produces a delay before the logic high output is applied to the non-inverting terminal of comparator 24. In particular, capacitor $C_6$ of the RC network must become charged before the logic high is applied to the comparator.

When the comparator 24 receives the logic high from the RC network, the comparator generates a logic high output to signify that an object is within a predetermined proximity to the sensing plate 10.

When the object is outside of the predetermined proximity to the sensing plate 10 either causing the oscillator to turn off or causing the oscillator 14 to generate an oscillating signal having a magnitude below the set threshold of the comparator 20, the output of the comparator 20 drops to a logic low level. When this occurs, capacitor $C_6$ of the RC network begins to discharge. As capacitor $C_6$ discharges the logic high applied to the comparator 24 is removed causing the comparator 24 to generate a logic low output signifying the absence of an object close to the sensing plate 10.

Because the proximity detector 8 changes its output from a logic high when an object is within a predetermined proximity to the sensing plate 10 to a logic low when the object is removed from the sensing plate, the proximity detector 8 serves to function as a removal detector providing an indication when an object has been removed from the removal detector.

Thus, the proximity detector 8 can be used in an alarm circuit to detect when an object such as valuable art, valuable automobiles etc. is removed from its intended position.

In this case, the sensing plate 10 would be positioned relative to the object spaced from but within the predetermined proximity to the object. As long as the object remains within the predetermined proximity, the proximity detector 8 generates output signifying a non-alarm condition. In the event that the object is removed from the sensing plate outside the predetermined proximity, the output of the proximity detector changes signifying an alarm condition. This change in output can be used to set off an alarm system.

The proximity detector may also be used to detect people. In a hospital environment, the proximity detector can be used to detect the presence of patients or the position of IV bags. When it is desired to monitor the position of patients, the sensing plate 10 can be attached to the hand of the patient (or other convenient location) to be monitored. In this case, the sensing plate 10 is encased in a dielectric to space the sensing plate 10 from the patient. As long as the sensing plate remains attached to the patient, the output of the proximity detector signifies a non-alarm condition but upon removal of the sensing plate, the output of the proximity detector changes signifying an alarm condition.

As should be apparent, the proximity detector 8 can be used to detect the presence of virtually any object where sensitivity non-contact detection of proximal objects at ground potential is required provided the object to be detected and the sensing plate form a plate capacity arrangement.

As one of skill in the art will appreciate, when the proximity detector 8 is to detect the presence of a hand, the capacitance of the capacitor constituted by the hand and sensing plate arrangement is small and is in the order of 10 pf. Since stray capacitance can overshadow the capacitance of the hand and sensing plate capacitor, the Hartley's LC oscillator is used since it is more sensitive than conventional RC oscillators. It should also be apparent that the sensitivity of the proximity detector 8 can be increased by increasing the area of the sensing plate 10.

The RC network prevents a change in output of the proximity detector 8 when a hand is placed near the sensing plate 10 for a duration insufficient to allow the capacitor $C_6$ of the RC network to charge or when a hand is removed from the sensing plate for a time insufficient to allow the capacitor $C_6$ to discharge. Thus, the delay circuit avoids the generation of false alarm output signals.

It should be appreciated that various modifications may be made to the present invention without departing from the scope thereof as defined by the appended claims.

What is claimed is:

1. A non-contact proximity detector to detect the presence of an object comprising:
   a single sensing plate forming one plate of a parallel plate capacitor, a second plate of said parallel plate capacitor being constituted by an object to be detected when said object to be detected is adjacent said sensing plate, said parallel plate capacitor changing capacitance as said object approaches said sensing plate; and
   a detection circuit coupled to said sensing plate and being responsive to a change in capacitance of said parallel plate capacitor and generating output representative of the presence of said object when said object is within a predetermined proximity to said sensing plate, wherein said detection circuit includes an oscillator responsive to the change in capacitance of said parallel plate capacitor and generating an oscillating signal, said oscillating signal varying as said capacitance of said parallel plate capacitor changes; and signal conditioning means responsive to said oscillating signal and generating said output when said oscillating signal signifies said object is within said predetermined proximity, said signal conditioning means including a delay circuit to delay generation of said output until said object remains within said predetermined proximity for a predetermined duration.

2. A proximity detector as defined in claim 1 wherein said signal conditioning means generates a logic high output when said object is within said predetermined proximity for said predetermined duration.

3. A proximity detector as defined in claim 1 wherein said oscillating signal has a magnitude which varies as a function of said capacitance and wherein said signal conditioning means includes a threshold detector to detect when the magnitude of said oscillating signal is above a threshold value, said signal conditioning means providing output to said delay circuit when the magnitude of said oscillating signal is above said threshold value.

4. A proximity detector as defined in claim 3 wherein said oscillator is adjustable to adjust the tuning and sensitivity thereof.

5. A proximity detector as defined in claim 3 wherein said signal conditioning means further includes an envelope demodulator to generate an envelope of said oscillating signal, a first comparator constituting said threshold detector receiving said envelope and providing output to said delay circuit when the magnitude of said envelope is above said threshold value, and a second comparator receiving output from said delay circuit after said predetermined duration has elapsed, said second comparator generating said output representative of the presence of said object in response to the output received from said delay circuit.

6. A proximity detector as defined in claim 5 wherein said delay circuit is an RC network.

7. A proximity detector as defined in claim 1 wherein said oscillator is an LC oscillator.

8. A non-contact proximity detector to detect the presence of a human appendage comprising:
   a single sensing plate forming one plate of a parallel plate capacitor, a second plate of said parallel plate capacitor being constituted by an appendage to be detected when said appendage to be detected is adjacent said sensing plate, said parallel plate capacitor changing capacitance as said appendage approaches said sensing plate; and
   a detection circuit coupled to said sensing plate and being responsive to a change in capacitance of said parallel plate capacitor and generating output representative of the presence of said appendage when said appendage is within a predetermined proximity to said sensing plate, wherein said detection circuit includes an oscillator responsive to the change in capacitance of said parallel plate capacitor and generating an oscillating signal, said oscillating signal varying as said capacitance of said parallel plate capacitor changes; and signal conditioning means responsive to said oscillating signal and generating said output when said oscillating signal signifies said appendage is within said predetermined proximity, said signal conditioning means including a delay circuit to delay generation of said output until said appendage remains within said predetermined proximity for a predetermined duration.

9. A proximity detector as defined in claim 8 wherein said appendage to be detected is a hand, said sensing plate being encased in a dielectric and being attached to the hand to be detected.

10. A proximity detector as defined in claim 8 wherein said signal conditioning means includes an envelope demodulator to generate an envelope of said oscillating signal, a first comparator receiving said envelope and providing output to said delay circuit when the magnitude of said envelope is above said threshold value, and a second comparator receiving output from said delay circuit after said predetermined duration has elapsed, said second comparator generating said output representative of the presence of said hand in response to the output received from said delay circuit.

11. A proximity detector as defined in claim 8 wherein said oscillator is an LC oscillator.

* * * * *